United States Patent
Yenikaya et al.

(10) Patent No.: US 7,849,423 B1
(45) Date of Patent: Dec. 7, 2010

(54) METHOD OF VERIFYING PHOTOMASK DATA BASED ON MODELS OF ETCH AND LITHOGRAPHY PROCESSES

(75) Inventors: Bayram Yenikaya, Sunnyvale, CA (US); Devendra Joshi, San Jose, CA (US); Paul A. Fornari, San Jose, CA (US); Jesus O. Carrero, Mountain View, CA (US); Abdurrahman Sezginer, Monte Sereno, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 165 days.

(21) Appl. No.: 11/781,108

(22) Filed: Jul. 20, 2007

Related U.S. Application Data

(60) Provisional application No. 60/807,967, filed on Jul. 21, 2006.

(51) Int. Cl.
*G06F 17/50* (2006.01)
*G06F 9/45* (2006.01)

(52) U.S. Cl. .................................. 716/2; 716/5; 716/19

(58) Field of Classification Search ...................... 716/2, 716/5, 19
See application file for complete search history.

(56) References Cited

U.S. PATENT DOCUMENTS

| | | | |
|---|---|---|---|
| 6,944,844 B2 | 9/2005 | Liu et al. | |
| 7,003,758 B2 | 2/2006 | Ye et al. | |
| 7,111,277 B2 | 9/2006 | Ye et al. | |
| 7,114,145 B2 | 9/2006 | Ye et al. | |
| 7,117,477 B2 | 10/2006 | Ye et al. | |
| 7,155,689 B2 | 12/2006 | Pierrat et al. | |
| 7,191,428 B2 | 3/2007 | Ye et al. | |
| 2003/0046653 A1* | 3/2003 | Liu ............................. | 716/19 |
| 2005/0177811 A1* | 8/2005 | Kotani et al. .................. | 716/21 |
| 2006/0126046 A1* | 6/2006 | Hansen ........................ | 355/55 |
| 2006/0236294 A1* | 10/2006 | Saidin et al. .................. | 716/19 |
| 2007/0143733 A1 | 6/2007 | Zach | |

OTHER PUBLICATIONS

Yu et al.; "Process Variation Aware OPC with Variational Lithography Modeling"; Aug. 2006; University of Texas at Austin ECE Department; pp. 1-6.*
Cobb et al.; "New Concepts in OPC"; Feb 2004; Mentor Graphics Corp.; pp. 1-11.*
Yu et al.; "Fast Lithography Simulation under Focus Variations for OPC and Layout Optimizations"; Apr. 2006; University of Texas at Austin ECE Department; pp. 1-10.*
Sezinger et al.,SPIE vol. 6156, p. 615613-1, SPIE, Bellingham, WA, 2006.

(Continued)

*Primary Examiner*—Sun J Lin
*Assistant Examiner*—Suresh Memula
(74) *Attorney, Agent, or Firm*—Sheppard Mullin Richter & Hampton LLP

(57) ABSTRACT

A photomask dataset corresponding to a target-pattern is verified by simulating a resist-pattern that will be formed in a resist layer by a lithography process, simulating an etched-pattern that will be etched in a layer by a plasma process wherein said simulation comprises calculating a flux of particles impacting a feature, and determining whether the etched-pattern substantially conforms to the target-pattern.

21 Claims, 7 Drawing Sheets

Flow chart of an embodiment of the present invention.

OTHER PUBLICATIONS

Mason et al., Proc. SPIE vol. 6349. p. 6349X-1, SPIE, Bellingham, WA, 2006.
Kang et al., Proc. SPIE vol. 6154, p. 6154EH-1, SPIE, Bellingham, WA, 2006.
Ogino et al., Proc. SPIE vol. 6151, p. 615129-1, SPIE, Bellingham, WA, 2006.
Hung et al., Proc. SPIE vol. 5992, p. 59922Z-1, SPIE, Bellingham, WA, 2005.
Kim et al., Proc. SPIE vol. 5853, p. 599, SPIE, Bellingham, WA, 2005.
Kim et al., Proc. SPIE vol. 5992, p. 599922U-1, SPIE, Bellingham, WA, 2005.
Torres et al., Proc. SPIE vol. 5992, p. 59923L-1, SPIE, Bellingham, WA, 2005.
Graur et al., Proc. SPIE vol. 5379, p. 202, SPIE, Bellingham, WA, 2004.
Belledent et al., Proc., SPIE vol. 5377, p. 1184, SPIE, Bellingham, WA, 2004.
Shang et al., Proc., SPIE vol. 5040, p. 431, SPIE, Bellingham, WA, 2003.
van Adrichem et al., SPIE vol. 5038, p. 1019, SPIE, Bellingham, WA, 2003.
Beale et al., SPIE vol. 896, SPIE, Bellingham, WA, 2002.

* cited by examiner

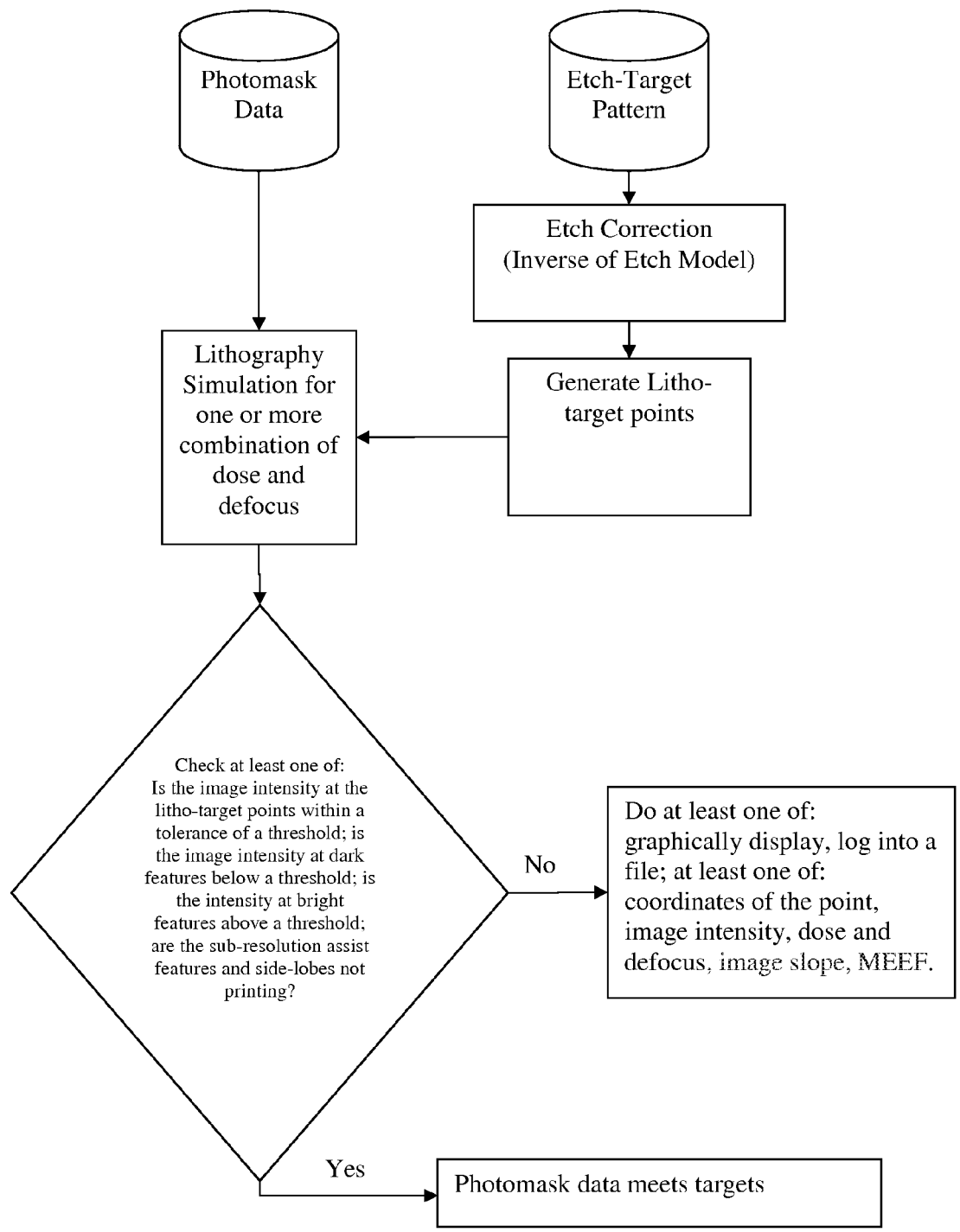
Figure 2. Flow chart of an embodiment of the present invention.

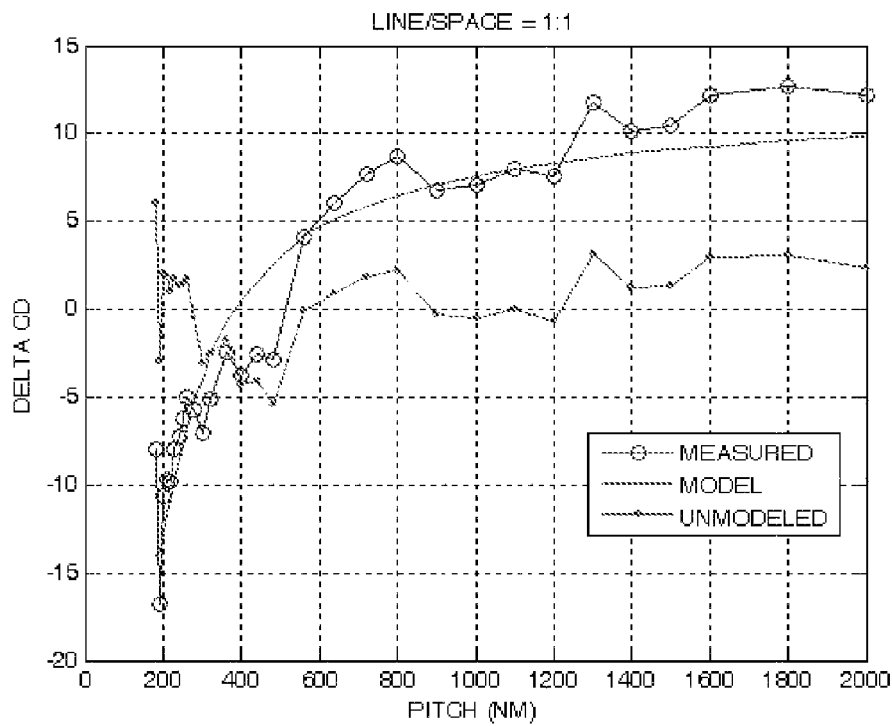
Figure 3.a
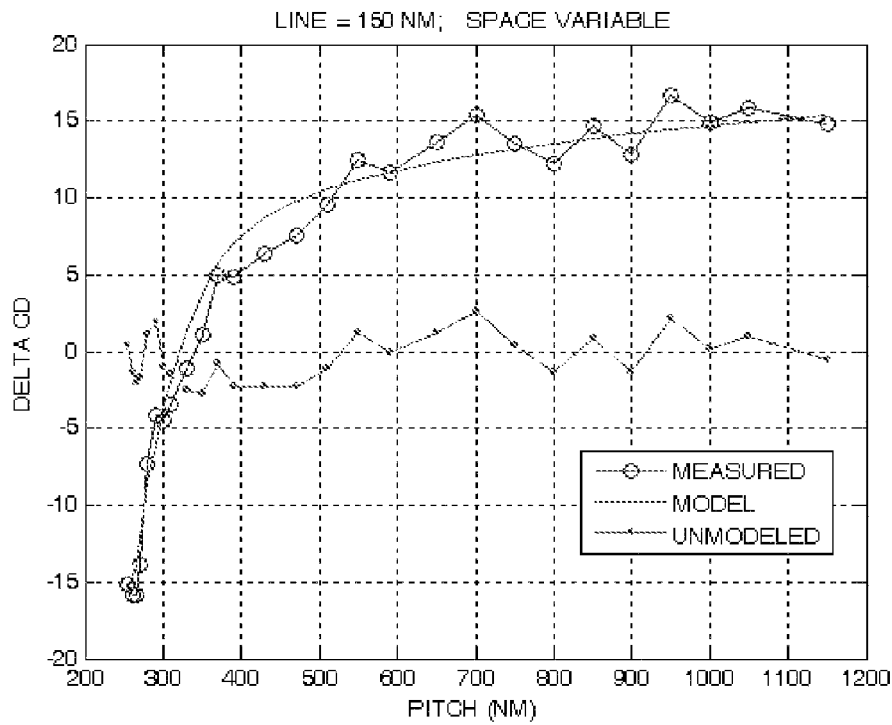
Figure 3.b

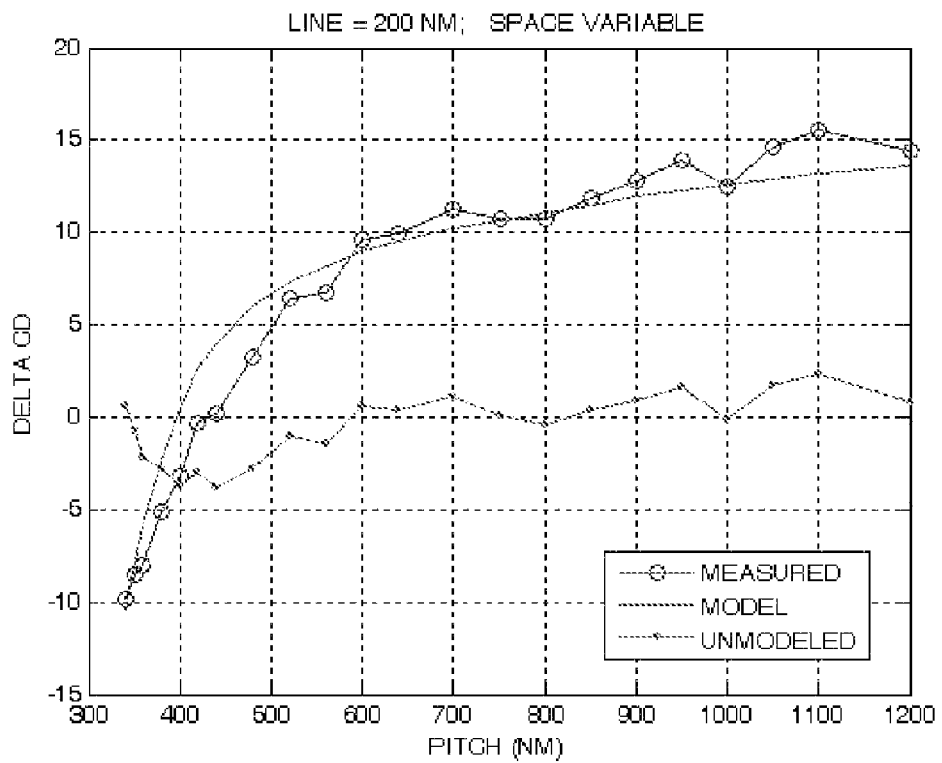
Figure 3.c
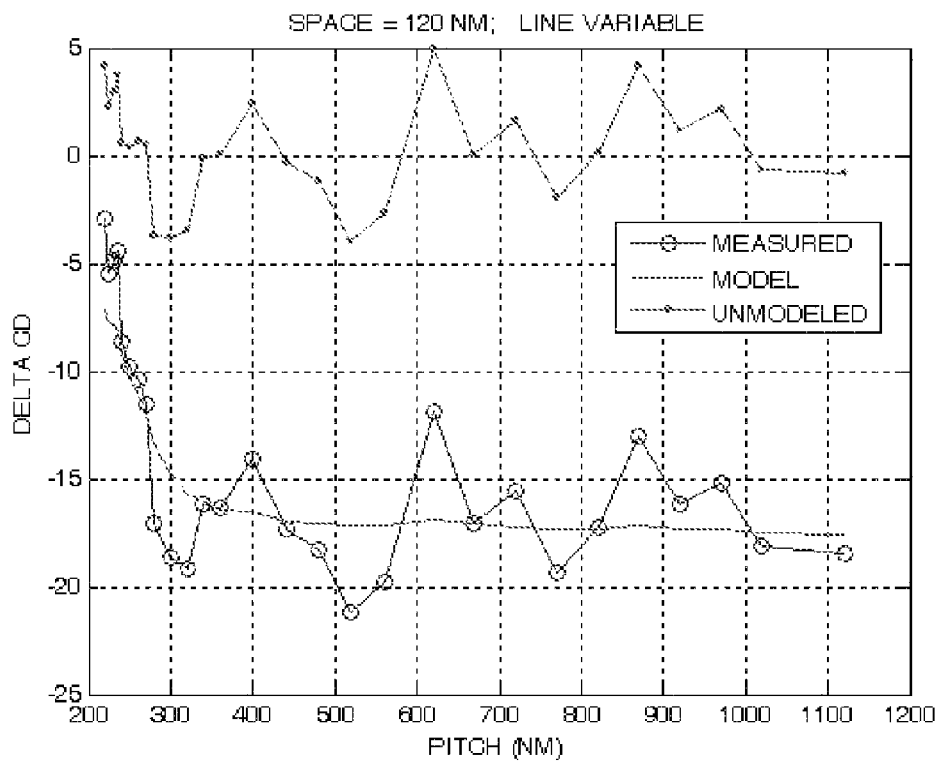
Figure 3.d

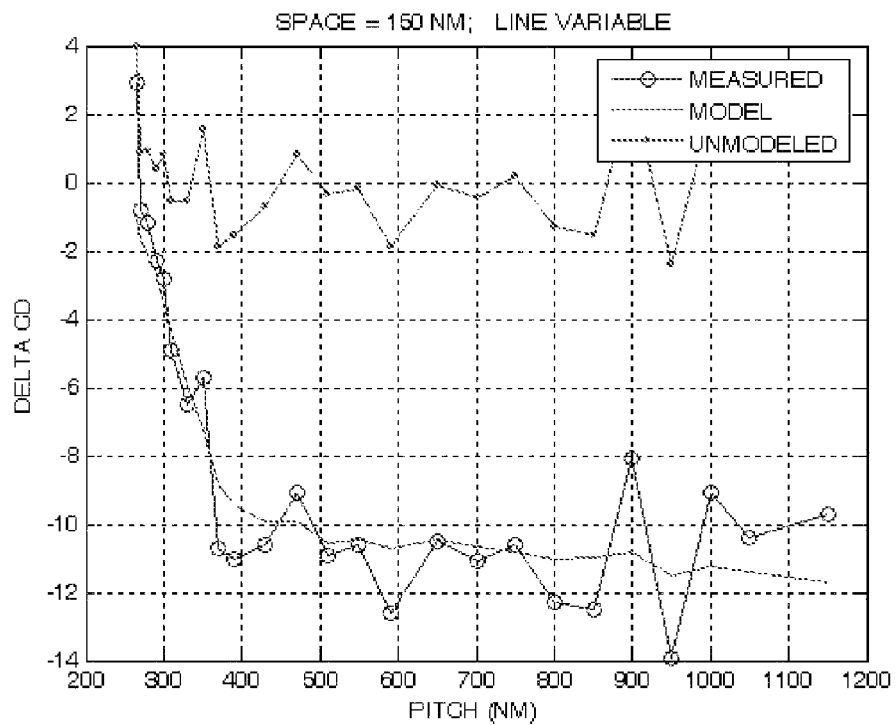
Figure 3.e
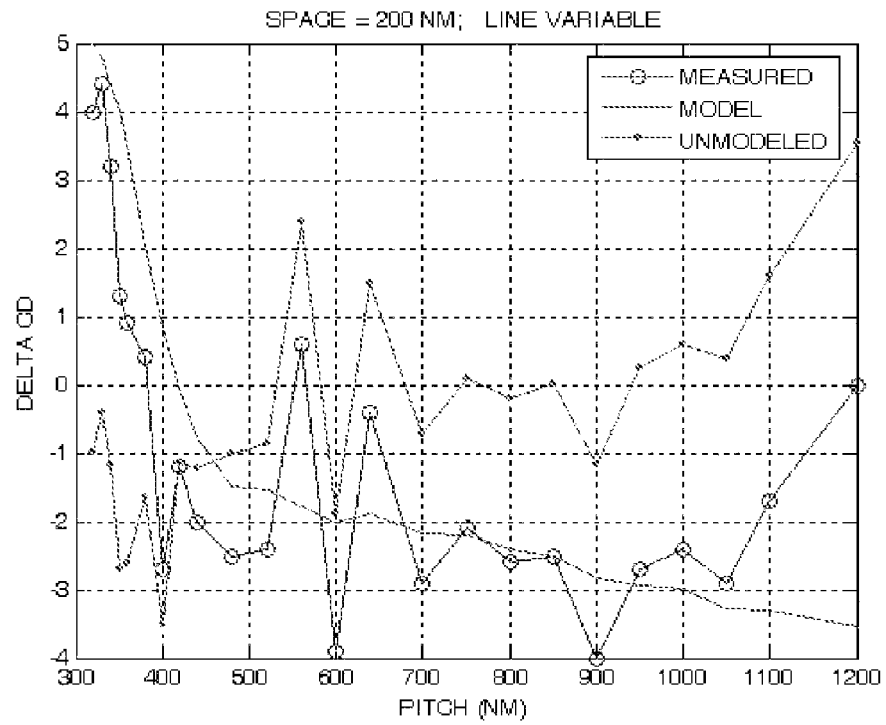
Figure 3.f

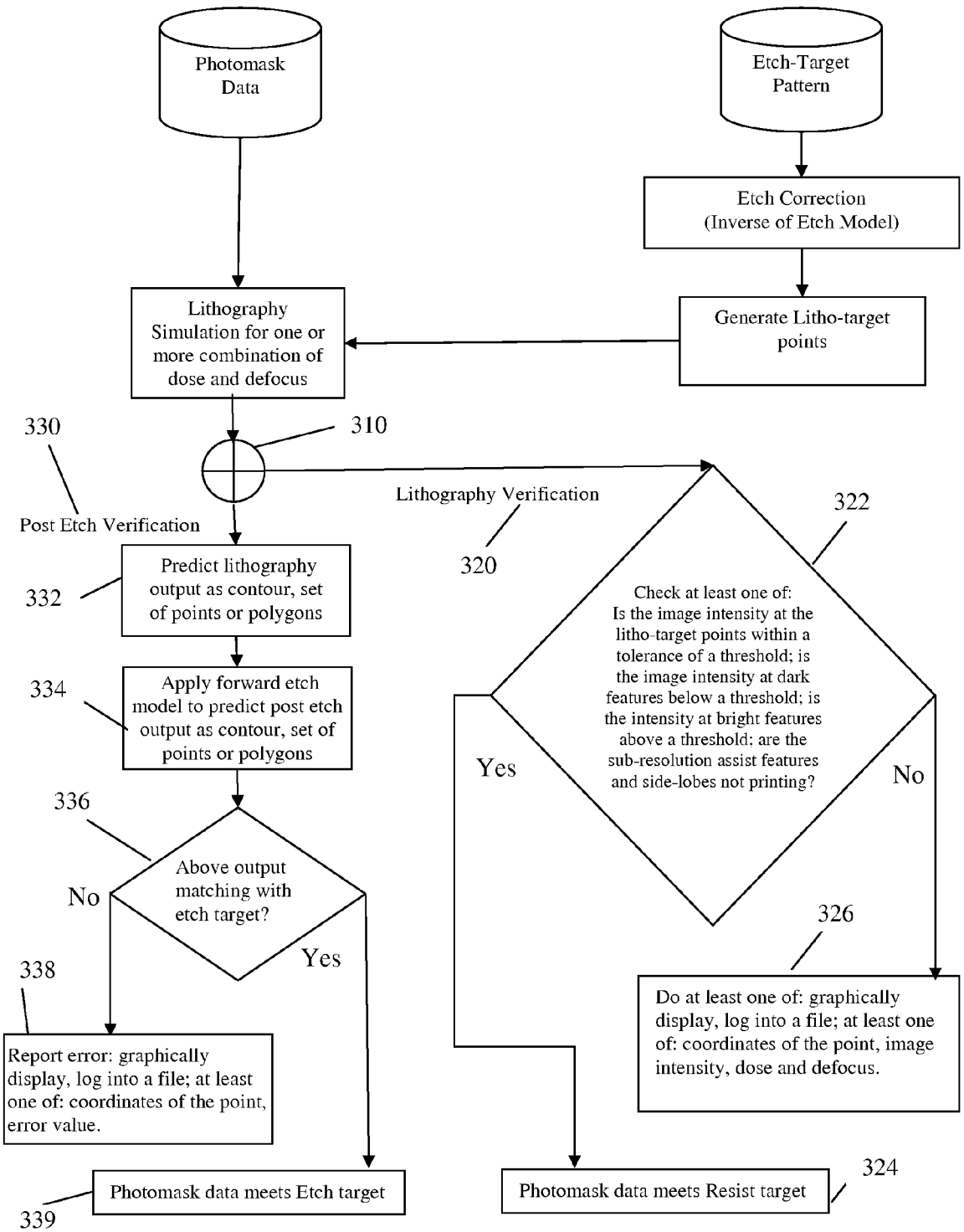
Figure 5: Flow chart for an embodiment of this invention

METHOD OF VERIFYING PHOTOMASK DATA BASED ON MODELS OF ETCH AND LITHOGRAPHY PROCESSES

CROSS-REFERENCE TO RELATED APPLICATION

This application claims benefit of U.S. Provisional Application No. 60/807,967 filed Jul. 21, 2006, the entire disclosure of which is incorporated herein by reference.

FIELD OF THE INVENTION

This invention relates to the general field of optical lithography. In particular, this invention relates to verifying that a given photomask data set will meet a set of design targets.

BACKGROUND

Layers of semiconductor devices are patterned using lithography and etch processes. Both of these processes distort the pattern that is being transferred from a photomask to a layer on a semiconductor wafer.

The pattern to be formed on the wafer will be called the target pattern for the purposes of this application. The target pattern is produced by design steps that include considerations of circuit function, electrical parameters of devices, placement of components on an integrated circuit, routing of connections, parasitic electrical parameters of interconnections, and timing analysis of the circuit. The target pattern comprises a set of polygons. It is usually stored and transmitted in a file that is in GDS-II or OASIS format.

A photomask is manufactured according to a photomask data set, which comprises a set of polygons. The photomask data set is what is sent to a mask shop when a photomask is ordered. The photomask data is derived from the target pattern. The process that starts with the target pattern, and that yields the photomask data, can include: insertion of assist features, assigning phase-shifts to transparent apertures on the photomask, applying rule-based or model-based optical proximity correction (OPC), or process proximity compensation (PPC; See: Apo Sezginer, Franz X. Zach, Bayram Yenikaya, Jesus Carrero, Hsu-Ting Huang, Proc. SPIE Vol. 6156, March 2006, SPIE Press, Bellingham, Wash.)

The goal of OPC is to render the pattern formed on a wafer similar to a target pattern. In the prior art, OPC algorithms have not always met this goal. OPC users have therefore resorted to verifying the OPC output by a model-based simulation. Verification is the art of checking, using a mathematical model of a manufacturing process, whether a given photomask data set will result in a sufficiently close approximation of the target pattern on the wafer. Prior art of verification includes these documents:

U.S. Pat. No. 7,117,477, Ye et al.
U.S. Pat. No. 7,114,145, Ye et al.
U.S. Pat. No. 7,111,277, Ye et al.
U.S. Pat. No. 7,003,758, Ye et al.
U.S. Pat. No. 7,191,428, Tang et al.
U.S. Pat. No. 7,155,689, Pierrat et al.
U.S. Pat. No. 6,944,844, Liu et al.
Mason et al., Proc. SPIE Vol. 6349, p. 63491X-1, SPIE, Bellingham, Wash., 2006
Kang et al., Proc. SPIE Vol. 6154, p. 61543J-1, SPIE, Bellingham, Wash., 2006
Ogino et al., Proc. SPIE Vol. 6151, p. 615129-1, SPIE, Bellingham, Wash., 2006
Hung et al., Proc. SPIE Vol. 5992, p. 59922Z-1, SPIE, Bellingham, Wash., 2005
Kim et al., Proc. SPIE Vol. 5853, p. 599, SPIE, Bellingham, Wash., 2005
Kim et al., Proc. SPIE Vol. 5992, p. 599922U-1, SPIE, Bellingham, Wash., 2005
Tones et al., Proc. SPIE Vol. 5992, p. 59923L-1, SPIE, Bellingham, Wash., 2005
Graur et al., Proc. SPIE Vol. 5379, p. 202, SPIE, Bellingham, Wash., 2004
Belledent et al., Proc. SPIE Vol. 5377, p. 1184, SPIE, Bellingham, Wash., 2004
Shang et al., Proc. SPIE Vol. 5040, p. 431, SPIE, Bellingham, Wash., 2003
van Adrichem et al., SPIE Vol. 5038, p. 1019, SPIE, Bellingham, Wash., 2003
Beale et al., SPIE Vol. 4889, p. 896, SPIE, Bellingham, Wash., 2002

A deficiency in the prior art is that verification has been performed using an optical model. Plasma etching imparts a proximity effect to the pattern formed on the wafer because the access of plasma to the side-wall of the pattern that is being etched, depends on the pattern. The access of the plasma to the side wall has not been taken into account in the prior art of verification.

SUMMARY OF THE INVENTION

According to a first aspect of the present invention there is provided a method of verifying a photomask dataset corresponding to a target-pattern, the method comprising (a) simulating a resist-pattern that will be formed in a resist layer by a lithography process; and (b) simulating an etched-pattern that will be etched in a layer by a plasma process wherein said simulation comprises calculating a flux of particles impacting a feature; and (c) determining whether the etched-pattern substantially conforms to the target-pattern.

According to a second aspect of the present invention there is provided a method of verifying a photomask data set corresponding to a target-pattern, the method comprising the following steps in the given order: (a) obtaining a lithography-target from the target-pattern using a mathematical model of the etch-process; and (b) calculating a lithographic image intensity at a point on the lithography-target; and (c) determining if the image intensity is in an acceptable range of values.

BRIEF DESCRIPTION OF THE DRAWINGS

The present invention, in accordance with one or more various embodiments, is described in detail with reference to the following figures.

FIG. 2 is a flow chart illustrating an example method in accordance with one embodiment of the current invention.

FIGS. 3A-3F are charts illustrating measured etch biases in accordance with one embodiment of the current invention.

FIG. 5 is a flow chart illustrating an example method in accordance with one embodiment of the current invention.

It will be appreciated that the invention is not restricted to the particular embodiments that have been described or illustrated, and that variations may be made therein without departing from the scope of the invention as defined in the appended claims, as interpreted in accordance with principles of prevailing law, including the doctrine of equivalents or any other principle that enlarges the enforceable scope of the claims beyond the literal scope.

DETAILED DESCRIPTION OF THE INVENTION

Photolithography transfers pattern(s) from one or more photomasks to a photoresist film coated on a semiconductor wafer. The pattern that is formed in photoresist acts as a mask, or a stencil, during a subsequent etching process. Critical features of integrated circuits are usually etched by so called plasma-etch or dry-etch processes. The dimensions of a feature in photoresist are different from the dimensions of the same feature, etched into a layer on the wafer. This difference between an etched dimension and the corresponding resist dimension is called: etch-bias or etch-skew. The etch-bias depends on the local details of the pattern and on the surrounding pattern density. In other words, the etch bias depends on some aspects of the pattern that is being etched. To be valid, verification has to account for the etch bias. For this purpose, we introduce the concepts of etch-target and litho-target.

Etch-target is a set of polygons or a set of curves that describe the desired result of wafer etch. Points on the etch target curves or polygons are etch target points. Etch-target is the same as the target pattern or target layout described in the Background Section above.

Litho-target is a set of polygons or a set of curves that describe the desired edges of resist features formed by photolithography. The etched pattern is determined by the pattern in photoresist. The litho target is such that, if the resist pattern substantially conforms to the litho-target, the resulting etch-pattern substantially conforms to the etch-target. Litho target points are points on the litho-target curves or polygons.

Figure 1:
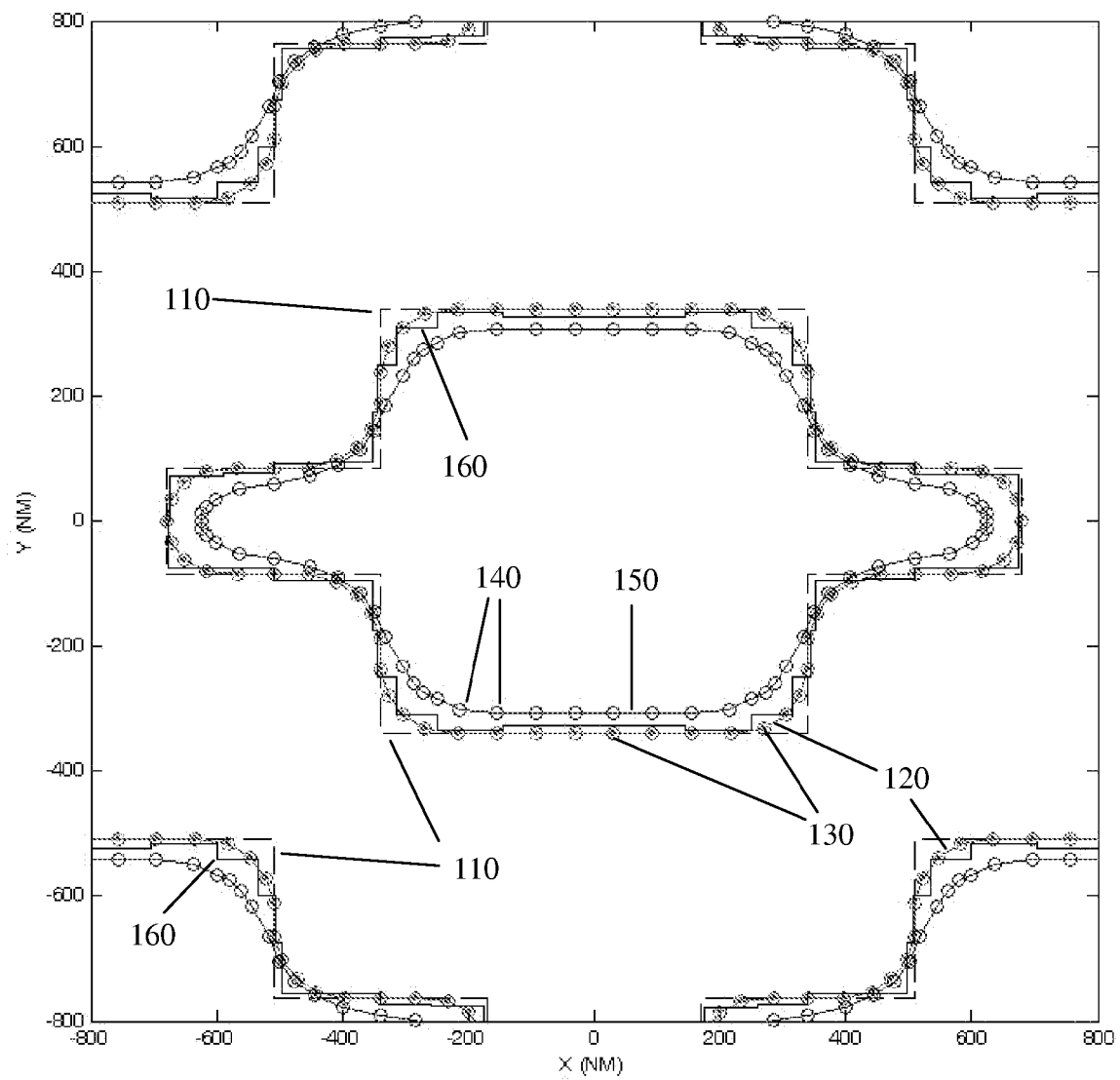
FIG. 1 is a diagram illustrating an example target polygon pattern that can be used in conjunction with one embodiment of the current invention.

According to an embodiment of this invention, verification comprises the following high-level steps, which are explained in reference to FIGS. 1 and 2:

A. Providing a computational model of the etch process; and

B. Obtaining a set of target polygons 110 that make up the target pattern $P_{TARGET}$ which describes the desired pattern to be etched into the wafer; and C. Approximating polygons 110 in the target pattern $P_{TARGET}$ by etch target curves 120 that have bounded curvature, and that closely match the target polygons except at their vertices; selecting etch target points 130 on the etch target curves 120; and D. For each etch target point 130, calculating the position of the corresponding litho target point 140, using a mathematical model of the etch process; the litho target points 140 lie on smooth litho target curves 150; and E. Obtaining the photomask data under test; and F. Providing a computational model of lithography; and a threshold such that either:
  a. a positive photoresist dissolves upon development only at locations where the image intensity exceeds the threshold; or
  b. a negative photoresist dissolves upon development only at locations where the image intensity is less than the threshold;

G. Calculating, using said computational model of lithography, intensity of an image formed in a photoresist layer, for one or more combinations of exposure-dose and defocus, at one or more of the following set of points:
  a. Litho target points 140;
  b. Points placed on sub-resolution assist features;
  c. Points placed on suspected side-lobes;
  d. Points that are placed on a regular two-dimensional grid; and H. Checking if the calculated image intensity satisfies at least one the following conditions:
  a. The difference between the image intensity at each litho target point 140 and the threshold is smaller than a tolerance;
  b. The intensity at points placed on sub-resolution assist features are such that the assist features do not appear in photoresist (that is: the intensity is greater than a threshold for a dark assist feature on bright background, or the intensity is less than a threshold for a clear assist feature on dark background);
  c. The intensity at points placed on suspected side-lobes are such that the side lobes do not print in photoresist (for example, for a positive photoresist and a dark background, the intensity is less than the threshold);
  d. Some points on the regular grid are on dark features. The intensity at these points is less than the threshold. Some points on regular grid are on bright features. The intensity at those points are greater than the threshold;
  e. Absolute value of image-slope at a litho target point 140 is greater than a pre-determined lower bound;
  f. Mask error enhancement factor, MEEF=Demagnification×∂(wafer CD)/∂(mask CD), is less than a previously determined upper bound;

I. Doing at least one of the following for a point where a condition in step H fails:
  a. Recording in a file the coordinates of the point;
  b. Recording in a file the image intensity;
  c. Recording in a file the exposure-dose and defocus at which a condition in step H failed;
  d. Recording in a file which of the conditions a, b, c, or d in step H failed;
  e. Graphically displaying the coordinates of the point, superimposed on a display of at least one of the following: the photomask pattern, the etch-target pattern, the litho-target pattern, a pseudo-color map of image intensity, a contour map of image intensity;
  f. Annotating a graphical display with at least one of the following: the intensity of the image at a failure point, the condition that failed (a, b, c, d, e, or f in step H).

These high-level steps are explained in more detail below.

Computational Model of the Etch Process

The etch model was described by Zach et al. in Utility application Ser. No. 11/541,921, filed Oct. 2, 2006, which is incorporated by reference.

Upon etching, the edge of a pattern is displaced in the plane of the wafer, in the direction that is normal (perpendicular) to the edge, by a lateral etch bias ΔEdge, which can be positive or negative. The mathematical model for the lateral etch bias is:

$$\Delta \text{Edge} = a_0 + a_{N+1} \Omega_{SKY,h} + \text{(resist pattern)} * \sum_{n=1}^{N} \frac{a_n}{2\pi\sigma_n^2} \exp\left(-\frac{x^2+y^2}{2\sigma_n^2}\right) \quad (3)$$

The term "lateral etch bias," or "etch bias" for short, refers to changes in the dimensions in the plane of the wafer. It is not to be confused by etch depth or a bias in the etch depth.

In equation (3), $a_0$ is a constant etch-bias. The term $\Omega_{SKY}$ is equal or related to a solid angle that subtends the visible part of the sky (plasma above the wafer) from a view point at a point on a sidewall of the etched pattern. Assuming the sidewall is impacted by plasma particles that are equally likely to travel in any direction, the rate of particles that impact the sidewall is proportional to the solid angle of the sky. Similarly, reaction products that are formed at the bottom (floor) of trenches that are being etched can sputter on to the sidewalls and form a polymer that protects the sidewall from further etching. The rate of such sputtering is governed by a similar "solid angle of the floor." The term $a_{N+1}\Omega_{SKY}$ is intended to approximately account for the combined effect of the plasma particles incident from the sky and the polymer deposition by particles sputtered from the floor. The view point on the sidewall is taken to be a distance h below the top surface of the etched pattern. In a preferred embodiment, the depth parameter h is adjusted by fitting the predictions of the model to measured etch biases. Alternatively, the depth h can be set to be a fixed fraction of the etch depth, such as half of the etch depth.

The function (resist pattern) (x,y) in Equation (3) takes the value 1 where there is resist on the wafer, and 0 where the resist has been removed. The symbol * indicates two-dimensional convolution. The summation on the right-hand-side of Equation (3) is a point-spread-function that accounts for pattern density effects in etching the wafer. Changes in the pattern density affect the rate at which reactants are consumed and reaction products are generated. Local variations in the densities of reactants and reaction products are partially equalized by diffusion processes which are not instantaneous. The point-spread-function is a linear superposition of Gaussians with length parameters $\sigma_1, \sigma_2, \ldots, \sigma_N$, which describes a combination of diffusion processes with various diffusion rates. According to certain embodiments, $\sigma_1, \sigma_2, \ldots, \sigma_N$ are assigned logarithmically spaced values between the minimum and maximum diffusion lengths that can be probed by the test patterns that are used to calibrate the etch model. In an alternative embodiment, the parameters $\sigma_1, \sigma_2, \ldots, \sigma_N$ are determined by minimizing the difference between predictions of the model and measured etch biases of test patterns. The amplitudes, or coefficients, $a_0, a_1, a_2, \ldots, a_{N+1}$ are adjustable, and a priori unknown, parameters of the etch model. The coefficient $a_{N+1}$ is the weight of the solid angle term, which accounts for deposition or ablation of material on the sidewall. Each of the coefficients $a_0, a_1, a_2, \ldots, a_{N+1}$ can be positive or negative.

Calibration of the Etch Model

A multitude of test patterns are printed on a wafer to calibrate the etch model. According to certain embodiments, the test patterns include line gratings. Dimensions of the photoresist pattern on the wafer are measured by electron microscopy (CD-SEM), or atomic force microscopy, or optical scatterometry. Then, the wafer is etched following the same etch process that will be used in the manufacturing of a semiconductor device. The dimensions of the etched patterns are measured. Care is exercised to take measurements at the same locations in the pattern before and after etch. The etch bias $\Delta$Edge is calculated from the difference of the resist and post-etch measurements. For example, for line gratings:

$$\Delta\text{Edge} = (CD_{ETCH} - CD_{LITHO})/2 \quad (4)$$

$CD_{LITHO}$ and $CD_{ETCH}$ are dimensions of the same feature in a test pattern before and after etching, respectively. They are also know as the develop inspection (DI) and final inspection (FI) critical dimensions, respectively. The parameters $a_1, a_2, \ldots, a_{N+1}$ of the model are obtained from $\Delta$Edge for a plurality of test targets with various line and space widths. The parameters $a_0, a_1, a_2, \ldots, a_{N+1}$ are obtained by linear regression, i.e., by solving a system of linear equations in the least-squares sense. For line-space targets, the linear system of equations is as follows:

$$\Delta\text{Edge}_m = \sum_{n=0}^{N} (A_{mn} a_n) + a_{N+1}\Omega_m; m = 1, \ldots, M \quad (5)$$

In Equation (5), the index m labels a multitude of line grating test targets. Each line grating has different combination of line and space widths. The parameters of the line gratings are as follows:

$K_{m,1} + K_{m,2} + 1$ = number of lines in the $m^{th}$ line grating target  (6)

$K_{m,1} + 1$ = line number in the $m^{th}$ grating on which the measurement is taken $L_m$ = line width in the $m^{th}$ line grating target $S_m$ = space width in the $m^{th}$ line grating target $P_m = L_m + S_m$ = pitch of the $m^{th}$ line grating target The first N coefficients in Equation (5) are convolutions of Gaussian kernels with $$A_{mn} = \frac{1}{2} \sum_{k=-K_{m,1}}^{K_{m,2}} \left[ \text{erf}\left(\frac{kP_m + L_m}{\sqrt{2}\,\sigma_n}\right) - \text{erf}\left(\frac{kP_m}{\sqrt{2}\,\sigma_n}\right) \right]; \text{ for } n > 0 \quad (7)$$

$A_{m,0} = 1$ the line grating: $\sigma_n = n^{th}$ Gaussian length parameter $$\text{erf}(z) = \frac{2}{\sqrt{\pi}} \int_0^z e^{-t^2} dt$$

The last term in Equation (5) is the solid angle of the sky seen from a point on the side wall of the $K_{m,1} + 1^{st}$ line in the $m^{th}$ line grating target, a distance h from the top of the line:

$$\Omega_m = \int_{-\pi/2}^{\pi/2} d\phi \int_0^{S_m \sec\phi} \frac{h\, r\, dr}{(h^2 + r^2)^{3/2}} = \pi - 2\sin^{-1}\frac{h}{\sqrt{h^2 + S_m^2}} \quad (8)$$

h = vertical distance from the top of the line to an observation point on the edge of the line.

In an alternative embodiment, $\Omega_m$ is replaced by $\Omega_m^{(l)}$ where:

$$\Omega_m^{(l)} = \int_{visible\ sky} \cos^l \theta\, d\Omega \quad (8.b)$$

The angle $\theta$ is the angle between the surface normal of the sidewall and the line segment from the observation point on the sidewall to a point on the integration surface. The integral is taken on an imaginary surface, parallel to the plane of the wafer, at the top of the etched features. The integral is taken over only the part of this plane at which the sky (plasma) is visible from the observation point on the sidewall. In a preferred embodiment, l=1. In the embodiment of Equation (8), l=0.

FIGS. 3.$a$-3.$f$ show measured etch biases that make up the calibration data; the etch biases calculated according to the best fitting model; and the differences between the measurements and the model, which are labeled "un-modeled." The horizontal axes indicate pitches (line width+space width) of line gratings. Each point on these figures corresponds to a line grating having a distinct combination of line and space widths. The measurements in FIGS. 3.$a$-3.$c$ are widths of lines. The measurements in FIGS. 3.$d$-3.$f$ are widths of spaces. Spaces are regions that are etched and lines are regions that are protected by a photoresist. Model parameters were determined by fitting the model to 169 measured etch biases in the least-squares sense. That is, the model parameters minimize the sum of squares of fit errors over 169 test patterns. In this example, the line gratings were printed using a lithography projector with a 193 nm exposure wavelength and a numerical aperture of NA=0.75. The layer that is etched is a poly-silicon gate layer with a hard mask. The hard mask and the poly-silicon are etched with two separate etch processes. The model is fitted to the final result etched in poly-silicon.

Once equation (5) is solved, the model has been calibrated and it can be used to predict etch bias of arbitrary 2-dimensional patterns. According to certain embodiments, the model is verified on one-dimensional and two-dimensional test patterns that were not used to calibrate the model. Verification is done by recording CD-SEM images or CD measurements of the verification pattern before and after etching, and comparing the etch bias to the predictions of the model.

Providing a Target Layout Having Polygons

The target layout is generated by circuit layout, routing, timing, and possibly, manufacturability considerations. The target layout is described by the union of a set of polygons. The polygons are typically specified by the coordinates of their vertices and stored in a file in GDS or OASIS format. The target layout is input to the method described in the invention.

Etch Target Points

Figure 4:
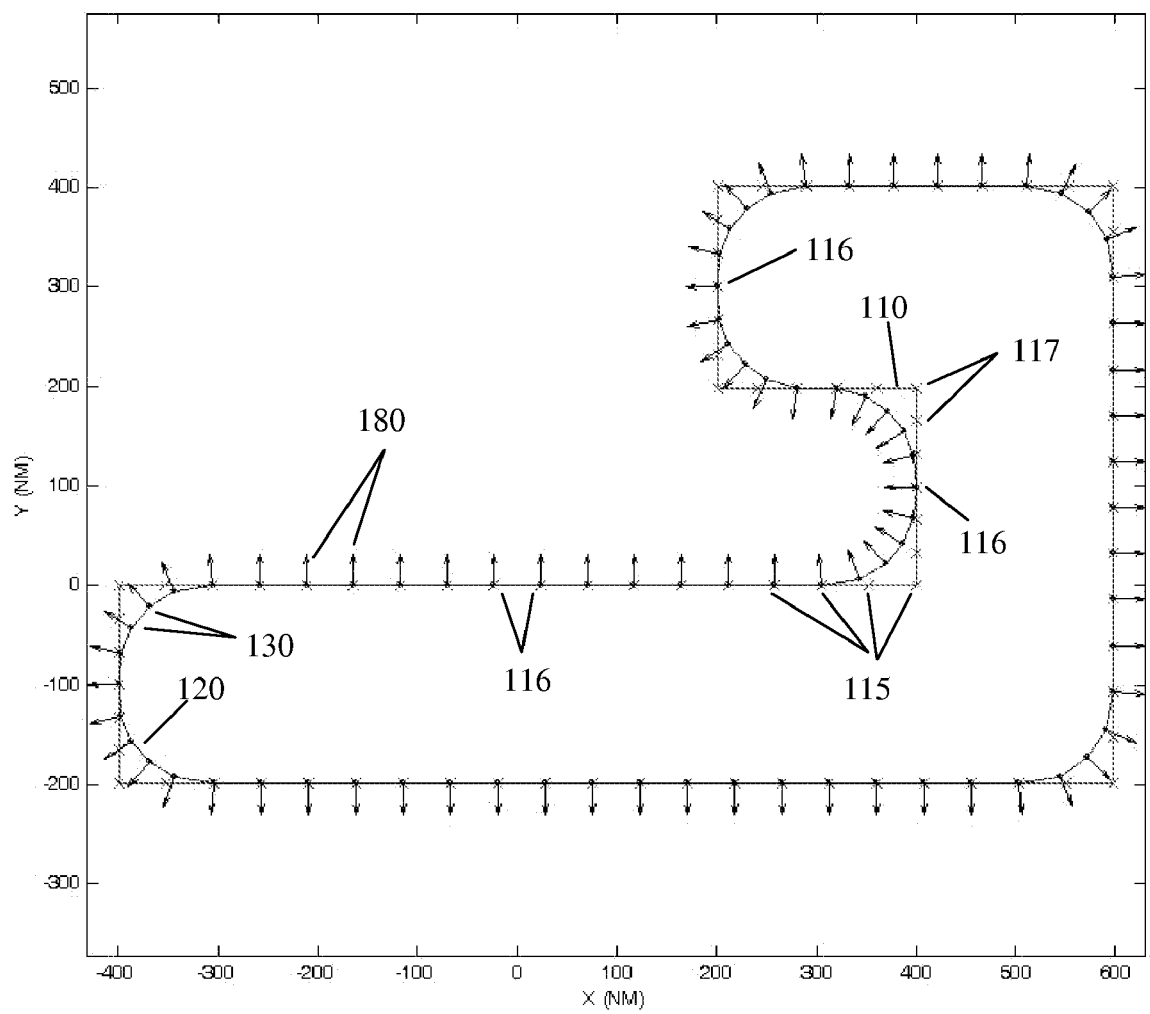
FIG. 4 is a diagram illustrating an example target polygon pattern with a smooth curve and normal vectors in accordance with one embodiment of the current invention.

Target polygons most commonly have 90° angles, in some cases 135° angles, at their vertices. Such sharp corners are impossible to produce reliably with a combination of photolithography and etching. According to certain embodiments, we round the corners of the target polygons to render them realizable. A practical advantage of rounding corners is: the direction that is perpendicular to the edge of a polygon is not well defined at the vertices of a polygon, but the normal direction is always unambiguous for a smooth closed curve that doesn't intersect itself. There are many ways of rounding the corners of a polygon: one approach is to replace the corners of the polygon with segments of circles or ellipses that are tangent to the edges of the polygon. A preferred embodiment of generating etch target points comprises the following steps which are explained referring to FIG. 4:

1. Merging overlapping target polygons to form a set of non-overlapping polygons 110; and
2. Placing points 115 on the edges of a polygon in the set of non-overlapping polygons 110. Let's label these points: $p_1, p_2, \ldots, p_N$ sequentially, traveling in the counter-clockwise direction around the polygon. Some of these points may be placed on the vertices of the polygon. The distance between adjacent points is preferably less than $0.25\lambda/NA$, where $\lambda$, and NA are the exposure wavelength and numerical aperture of the lithography projector. This measure is taken because according to certain embodiments the etch target points evolve into the lithography target points. The intensity of the lithography image is band-limited in the spatial-frequency domain with a Nyquist sampling rate of $0.25\lambda/NA$.
3. Classifying each target point into one of a multitude of categories such as: points 116 that should not move (these are points at the center of a line-end and points that are away from any vertex); and points 117 that will evolve (these are points in the vicinity of at least one vertex). Points that will evolve are optionally further classified into classes such as: 90° or 135°, inner or outer corners; points on a small jog; and points on a Z-bend. An achievable curvature is assigned to each class.
4. Assigning an achievable curvature for each moveable point $p_n$ according to its class; and
5. Recursively evolving each movable point according to: $p_n^{(k+1)} = (1-t_n^k)p_n^{(k)} + t_n^k(p_{n+1}^{(k)} + p_{n-1}^{(k)})/2$. The superscript (k) indicates the recursion or iteration number, or equivalently, time-index in the time-evolution. The subscript n sequentially labels the points around the target polygon. The evolution (displacement) is calculated for each of the points $p_1, p_2, \ldots, p_N$ on a polygon, each point $p_n^{(k)}$ is moved to its new location $p_n^{(k+1)}$, and the recursion is repeated. The parameter $0 \leq t_n^k \leq 1$ is between zero and one, and it can be different for each point and at each iteration. The parameter $t_n^k$ increases with increasing curvature at point $p_n^{(k)}$. The larger the parameter $t_n^k$, the faster point $p_n^{(k)}$ moves. Keeping $t_n^k$ bounded from above by 1 ensures that a target curve does not intersect itself as it evolves. If the curvature at $p_n^{(k)}$ drops below its assigned achievable curvature, $t_n^k$ is set to zero, which halts the evolution of the target curve at that location. FIG. 4 shows the initial points 115 and the points 130 at the final iteration. For clarity, points at intermediate iterations are not shown.
6. Optionally deleting one of the adjacent points, or replacing two adjacent points with their midpoint, if the distance between adjacent points falls below a preset value. The purpose of this is to eliminate redundant target points, since all computations to follow take a time that is proportional to the number of target points.
7. Repeating steps 5 and 6 until the curvature at each remaining etch-target point is less than or equal to its achievable curvature.

This method replaces a target polygon 110 with a set of etch-target points 130 that lie on a smooth curve 120. The smooth curve 120 is not explicitly defined but it is represented by points $p_1^{(K)}, p_2^{(K)}, \ldots$ (130 in FIG. 1) where the superscript (K) refers to the final step of the above time-evolution. Since we do not describe all points on the smooth curve 120, one might question the distinction of a polygon and a set of points $p_1^{(K)}, p_2^{(K)}, \ldots, p_N^{(K)}$ describing a smooth curve. The distinction is: the absolute value of the angle between the vector $p_{n-1}^{(K)} p_n^{(K)}$ and the vector $p_n^{(K)} p_{n+1}^{(K)}$ is substantially less than 45° for all etch target points 130 on the curve 120. This is not true for polygons in a circuit layout or polygons that comprise a photomask data set. When we say a subset of etch target points or lithography target points $p_1^{(K)}, p_2^{(K)}, \ldots p_N^{(K)}$ describe a smooth curve, we mean the angle between the vector $p_{n-1}^{(K)} p_n^{(K)}$ and the vector $p_n^{(K)} p_{n+1}^{(K)}$ is substantially less than 45° for each point $p_n^{(K)}$ in the subset. A closed, smooth curve can be fitted to the target points $p_1^{(K)}$, $p_2^{(K)}, \ldots p_N^{(K)}$ that belong to a polygon 110, such that the smooth curve does not substantially deviate from the line segments that join adjacent target points (line segments: $p_1^{(K)} p_2^{(K)}$; $p_2^{(K)} p_3^{(K)}$; ...; $p_{N-1}^{(K)} p_N^{(K)}$; $p_N^{(K)} p_1^{(K)}$).

What we mean by curvature of the smooth curve at a point p on the curve is the magnitude of the vector $d^2p(s)/(ds)^2$ where p(s) is the parametric representation of a point on the curve, wherein the parameter s is the path length along the curve measured from an arbitrary point on the curve. In practice, since we only have a set of points $p_1, p_2, \ldots, p_N$ on the smooth curve, we numerically calculate the curvature at $p_n$ according to:

$$curvature_n = 2\frac{\|p_{n-1} - p_n\|p_{n+1} + \|p_{n+1} - p_n\|p_{n-1} - (\|p_{n-1} - p_n\| + \|p_{n+1} - p_n\|)p_n}{\|p_{n-1} - p_n\|\|p_{n+1} - p_n\|(\|p_{n-1} - p_n\| + \|p_{n+1} - p_n\|)} \quad (9)$$

In this discussion, $p_n$ refers to one of many points on a curve that are sequentially labeled. The points $p_{n-1}$ and $p_{n+1}$ are adjacent to $p_n$. It is understood that $p_{n+1}$ stands for $p_1$ if n=N is the last point. Similarly, $p_{n-1}$ is understood to stand for $p_N$ if n=1 is the first point.

Obtaining Litho Target Points from Etch Target Points

Etch target points 130 are selected on etch target curves 120. The outward unit normal $\vec{n}$ of each curve is calculated at each target point 130. The outward normal vector (180 in FIG. 4) of a smooth curve p(s) in the xy-plane, parametrized by its path length s, is:

$$\vec{n}(s) = \frac{dp(s)}{ds} \times \hat{z} \quad (10)$$

The unit vector $\hat{z}$ is normal to the plane of the wafer. The normal vector $\vec{n}_m$ at a point $p_m$ on a smooth, closed curve that passes through the points $p_1, p_2, \ldots, p_N$ is numerically calculated as follows:

$$\vec{n}_m = \frac{\|p_{m-1} - p_m\|^2 p_{m+1} - \|p_{m+1} - p_m\|^2 p_{m-1} + (\|p_{m+1} - p_m\|^2 - \|p_{m-1} - p_m\|^2)p_m}{\|p_{m-1} - p_m\|\|p_{m+1} - p_m\|(\|p_{m-1} - p_m\| + \|p_{m+1} - p_m\|)} \quad (11)$$

The corresponding litho target point 140 is displaced by $-\vec{n} \Delta Edge$ from 130 where $\Delta Edge$ is the etch bias calculated by the etch model. The solid angle and the convolutions in (3) are calculated for the pattern defined by the etch target points.

In the preferred embodiment, the model of Equation (5) is fitted to required corrections that are experimentally observed. In this embodiment, (5) is an approximation to the inverse of the etch model. The etch compensation, that is, the inverse of the etch model, can be rapidly calculated by this method.

Calculation of the Optical Lithography Image Intensity

The intensity of the latent image in a photoresist film deposited on a wafer can be expressed as:

$$I(x, y; z) = \sum_{n=1}^{N} \mu_n \left| \int \int V_n^*(x' - x, y' - y; z) m(x', y') dx' dy' \right|^2 \quad (13)$$

(See: N. Cobb et al., "Mathematical and CAD Framework for Proximity Correction," Proc. SPIE Vol. 2726, p. 208, 1996) In (13), which is derived from the Kirchhoff approximation, $\mu_1, \mu_2, \ldots, \mu_N$ are positive-valued eigenvalues and $V_1, V_2^*, \ldots, V_N^*$ are complex conjugate of eigenfunctions of a Hermitian, positive-semidefinite operator; and m(x, y) is the complex transmission coefficient of the mask at the point (x, y). For binary masks, m(x, y)=1 in clear areas, and m(x, y)=0 in opaque areas. In 180° phase-shifted windows on the photomask, m(x, y)=−1. In general, in a $\phi$-radian phase-shifted window, m(x, y)=$e^{i\phi}$. For an attenuated phase-shift feature with power transmission coefficient T, the mask function takes the value: m(x, y)=$e^{i\phi}\sqrt{T}$ wherein the nominal value of the phase shift is: $\phi=\pi$. For reflective masks, m(x, y) is the complex reflection coefficient of the mask at the position (x, y). The focus variable z, denotes the position of the wafer with respect to best focus. The variable z is not to be confused with the vertical position inside the photoresist.

The intensity in the Equation (13) can also be computed in frequency domain as;

$$I(x, y; z) = \sum_{n=1}^{N} \mu_n \left| IFT\{\hat{V}_n^* \hat{m}\}(x, y, z) \right|^2 \quad (14)$$

In Equation (14), $\hat{V}_n$ and $\hat{m}$ represent the 2-dimensional spatial Fourier transforms of $V_n$, and m, respectively. The IFT refers to the Inverse Fourier Transform. In a preferred embodiment the intensities are computed on a grid, with Nyquist Sampling rate or denser, and the values at the points of interest are interpolated from the values at the grid points.

Alternative Embodiment

According to an embodiment of this invention, verification comprises the following high-level steps, which are explained in reference to FIGS. 1, 4 and 5:
  A. Providing a computational model of the etch process; and
  B. Obtaining a set of target polygons 110 that make up the target pattern $P_{TARGET}$ which describes the desired pattern to be etched into the wafer; and
  C. Approximating polygons 110 in the target pattern $P_{TARGET}$ by etch target curves 120 that have bounded curvature, and that closely match the target polygons except at their vertices; selecting etch target points 130 on the etch target curves 120; and
  D. For each etch target point 130, calculating the position of the corresponding litho target point 140 using a computational model of the etch process, wherein the litho target points 140 lie on smooth litho target curves 150; and
  E. Obtaining the photomask data under test; and
  F. Providing a computational model of lithography; and a threshold such that either:
    a. a positive photoresist dissolves upon development only at locations where the image intensity exceeds the threshold; or b. a negative photoresist dissolves upon development only at locations where the image intensity is less than the threshold;

G. Calculating, using said computational model of lithography, intensity of an image formed in a photoresist layer, for one or more combinations of exposure-dose and defocus, at one or more of the following set of points:
   a. Litho target points 140;
   b. Points placed on sub-resolution assist features;
   c. Points placed on suspected side-lobes;
   d. Points that are placed on a regular two-dimensional grid; and H. At stage 310, there are two possible verifications, namely lithography verification 320 and post etch verification 330.

I. Verification 320 is accomplished in step 322 by checking if the calculated image intensity satisfies at least one the following conditions:
   a. The difference between the image intensity at each litho target point 140 and the threshold is smaller than a tolerance;
   b. The intensity at points placed on sub-resolution assist features are such that the assist features do not appear in photoresist (that is: the intensity is greater than the threshold for a dark assist feature on bright background, or the intensity is less than the threshold for a clear assist feature on dark background);
   c. The intensity at points placed on suspected side-lobes are such that the side lobes do not print in photoresist (for example, for a positive photoresist and a dark background, the intensity is less than the threshold);
   d. Some points on the regular grid are on dark features. The intensity at these points is less than the threshold. Some points on regular grid are on bright features. The intensity at those points are greater than the threshold;

J. Doing at least one of the following for a point where a condition in step H fails 326:
   a. Recording in a file the coordinates of the point;
   b. Recording in a file the image intensity;
   c. Recording in a file the exposure-dose and defocus at which a condition in step H failed;
   d. Recording in a file which of the conditions a, b, c, or d in step H failed;
   e. Graphically displaying the coordinates of the point, superimposed on a display of at least one of the following: the photomask pattern, the etch-target pattern, the litho-target pattern, a pseudo-color map of image intensity, a contour map of image intensity;
   f. Annotating a graphical display with at least one of the following: the intensity of the image at a failure point, the condition that failed (a, b, c, or d in step H).

K. If all conditions in step 322 as described in I are passed then Photomask data is good for resist target. Now step 320 is complete.

L. Verification 330 is accomplished by predicting lithography output in 332 from step G as:
   a. Resist contour based on threshold;
   b. Predicting the resist position, based on threshold, for set of points;
   c. Predicting the resist output as polygons derived from either of above two methods;

M. Determine the post etch $P_{Etch}$ pattern, by applying the forward etch simulation 334, and represent the pattern by at least one of: contours, a set of points, polygons.

N. Compare results of M with etch target 336;

O. Doing at least one of the following for a point where a condition in step N fails 338:
   a. Recording in a file the coordinates of the point;
   b. Recording in a file the distance between the predicted etch position and etch target,
   c. Recording in a file the difference between a dimension of a feature as predicted in step M, and as in the etch target pattern,
   d. Graphically displaying the coordinates of the point, superimposed on a display of at least one of the following: the photomask pattern, the etch-target pattern, predicted etch-pattern, the litho-target pattern, a pseudo-color map of image intensity, a contour map of image intensity;

P. If comparison as described in N passes, then photomask data is good for etch target 339. Now step 330 is complete and the photomask data is verified with post etch target.

It will be appreciated that the invention is not restricted to the particular embodiment that has been described, and that variations may be made therein without departing from the scope of the invention as defined in the appended claims, as interpreted in accordance with principles of prevailing law, including the doctrine of equivalents or any other principle that enlarges the enforceable scope of the claims beyond the literal scope. Unless the context indicates otherwise, a reference in a claim to the number of instances of an element, be it a reference to one instance or more than one instance, requires at least the stated number of instances of the element but is not intended to exclude from the scope of the claim a structure or method having more instances of that element than stated.

The invention claimed is:

1. A method of verifying a photomask dataset corresponding to a target-pattern, the method comprising:
   obtaining a target polygon having a plurality of vertices and edges;
   approximating the target polygon with bounded curvature to create an etch target curve for a wafer;
   defining a set of etch target points on the etch target curve;
   using a mathematical model of an etch-process to define a set of photoresist points corresponding to the set of etch target points, the mathematical model comprising a model of sidewall effects of an etchant;
   obtaining a photoresist curve from the set of photoresist points; and
   storing the photoresist curve on a non-transitory computer readable medium.

2. A method according to claim 1, wherein the step of using a mathematical model comprises calculating an optical image formed in a resist layer.

3. A method according to claim 1, wherein the step of using a mathematical model comprises calculating an image formed by an electron beam.

4. A method according to claim 1, wherein the step of using a mathematical model comprises simulating an etched-pattern that will be etched in a layer for more than one dose and defocus value, and a set of photoresist points are defined for each dose and defocus value.

5. A method according to claim 1, wherein the step of using a mathematical model further comprises at least one of:
   checking if an image slope is in an acceptable range of values; and
   checking if a mask error factor is in an acceptable range of values.

6. A method according to claim 1, further comprising determining an etched-pattern from the photoresist curve, wherein the step of determining the etched-pattern comprises:

checking if a feature in the target-pattern is absent in the etched-pattern;

checking if a feature in the target-pattern is broken into more than one disjoint features in the etched-pattern that;

checking if more than one features that are disjoint in the target-pattern are merged in the etched-pattern;

checking if a line-feature is pinched;

checking if a dimension of a feature in the etched-pattern is substantially different than a corresponding dimension in the target-pattern; or checking if a mask error factor is in an acceptable range of values.

7. A method according to claim 6, wherein a result of checking is logged into a file.

8. A method according to claim 6, wherein the feature is classified according to a geometric property of the feature and results of checking are binned according their classification.

9. A method according to claim 6, wherein a results of checking is displayed graphically, superimposed on at least one of: the target-pattern, photoresist curve, etched-pattern.

10. A method of verifying a photomask data set corresponding to a target-pattern, the method comprising the following steps in the given order:

approximating the target-pattern with bounded curvature to create an etch target curve for a wafer;

defining a set of etch target points on the etch target curve;

obtaining a photoresist-target from the target-pattern using a mathematical model of the etch-process to define a set of photoresist points corresponding to the set of etch target points and obtaining the photoresist-target from the set of photoresist points;

calculating a lithographic image intensity at a point on the photoresist-target;

determining if the image intensity is in an acceptable range of values; and storing the photoresist-target on a non-transitory computer readable medium.

11. A method according to claim 10, further comprising at least one of:

checking if an image slope is in an acceptable range of values; and checking if a mask error factor is in an acceptable range of values.

12. A method according to claim 10, wherein the step of obtaining the photoresist-target comprises calculating the effect of plasma-etching of a material.

13. A method according to claim 10, wherein the step of obtaining the photoresist-target further comprises calculating a rate of material deposition or erosion.

14. A method according to claim 10, wherein step the step of obtaining the photoresist-target further comprises calculating a flux of particles impacting a feature.

15. A method according to claim 10, wherein the step of calculating the lithographic image intensity comprises calculating an optical image formed in a resist layer.

16. A method according to claim 10, wherein the step of calculating the lithographic image intensity comprises calculating an image formed by an electron beam.

17. A method according to claim 10, wherein the steps of calculating the lithographic image intensity and determining if the image intensity is in the acceptable range of values are repeated for more than one set of values of dose and defocus.

18. A method according to claim 10, wherein the acceptable range of values is determined from an image slope and at least one of: an edge-placement tolerance; a critical-dimension tolerance.

19. A method according to claim 10, wherein a result of determining is logged into a file.

20. A method according to claim 10, wherein the feature is classified according to a geometric property of the feature and results of determining are binned according their classification.

21. A method according to claim 20, wherein a results of determining is displayed graphically, superimposed on at least one of: the target-pattern, photoresist-target.

* * * * *